United States Patent [19]
Bessot et al.

[11] Patent Number: 5,640,341
[45] Date of Patent: Jun. 17, 1997

[54] MEMORY CELL INSENSITIVE TO COLLISIONS OF HEAVY IONS

[75] Inventors: Denis Bessot, Saint Loup Gammas; Raoul Velazco, Grenoble, both of France

[73] Assignee: Centre National de la Recherche Scientifique, Paris, France

[21] Appl. No.: 532,726
[22] PCT Filed: Mar. 16, 1994
[86] PCT No.: PCT/FR94/00287
§ 371 Date: Dec. 11, 1995
§ 102(e) Date: Dec. 11, 1995
[87] PCT Pub. No.: WO94/22143
PCT Pub. Date: Sep. 29, 1994

[30] Foreign Application Priority Data

Mar. 18, 1993 [FR] France .................................. 93 03333

[51] Int. Cl.$^6$ ............................................ G11C 11/40
[52] U.S. Cl. ................................................... 365/156
[58] Field of Search ................................ 365/156, 154, 365/155, 190; 327/21 A

[56] References Cited

U.S. PATENT DOCUMENTS

| | | | |
|---|---|---|---|
| 3,928,773 | 12/1975 | Oguey | 327/115 |
| 4,387,444 | 6/1983 | Edwards | 365/156 |
| 4,403,306 | 9/1983 | Tokushige et al. | 365/156 |
| 4,852,060 | 7/1989 | Rockett, Jr. | 365/156 |
| 5,075,581 | 12/1991 | Kamata | 326/67 |

*Primary Examiner*—Tan T. Nguyen
*Attorney, Agent, or Firm*—Lowe, Price, LeBlanc & Becker

[57] ABSTRACT

A differential memory cell comprises two sets, each including first P-channel, second N-channel and third N-channel transistors, connected in series between a high and a low supply voltage. The gate of one of the N-channel transistors of each set is connected to the output node of the other set. The gate of the other N-channel transistor of each set is connected to the gate of the first transistor of the same set. A fourth P-channel transistor, associated with each set, is connected between the high voltage and the gate of the first transistor of the set. A fifth P-channel transistor, associated with each set, is connected between the gate of the first transistor of the set and a read/write line or the low voltage.

9 Claims, 6 Drawing Sheets

MEMORY CELL INSENSITIVE TO COLLISIONS OF HEAVY IONS

The present invention relates to static memory cells and more particularly to memory cells whose state is not modified by the collision of a heavy ion on a sensitive area of the cell.

Electronics devices may, under some conditions, especially in space, be subjected to particle bombardments, especially heavy ion bombardments. When the drain region of a MOS transistor biased in a predetermined direction is crossed by a heavy ion, the MOS transistor generates a parasitic pulse at its drain. Such a parasitic phenomenon, usually named "upset", may cause impairing effects, especially the state of the memory cell may be changed by the action of the parasitic pulse on various transistors of the cell.

FIG. 1A represents the structure of a conventional memory cell of the differential type (i.e., a cell that stores data as two complementary states). This cell is used to fabricate any type of flip-flops, registers and Static Random Access Memories (SRAMs). An SRAM, unlike a dynamic memory (DRAM), is a memory that does not require refreshing signals to maintain its state.

The cell includes two head-to-tail connected inverters. The first inverter comprises a P-channel MOS transistor MP1 and an N-channel MOS transistor MN1 whose drains are connected together and constitute the output Q of the inverter. The sources of transistors MP1 and MN1 are connected to a high voltage Vdd and to a low voltage Vss, respectively. The second inverter comprises a P-channel MOS transistor MP2 and an N-channel MOS transistor MN2 connected like transistors MN1 and MP1, respectively. The drains of transistors MP2 and MN2 are connected together and constitute the output Q* of the second inverter. The gates of transistors MP2 and MN2 (the input of the second inverter) are connected to the output Q of the first inverter. The gates of transistors MP1 and MN1 (the input of the first inverter) are connected to the output Q* of the second inverter.

An N-channel MOS transistor MN3 connects the output Q to a data line D. An N-channel MOS transistor MN4 connects the output Q* to a data line D*. Lines D and D* convey differential data (the states of lines D and D* are complementary) to be read and to be stored in the memory cell. The gates of transistors MN3 and MN4 are controlled by a read/write line RW.

FIG. 1B represents the cell of FIG. 1A in its initial state. Nodes having a voltage close to the low voltage Vss are indicated by 0s; nodes having a voltage close to the high voltage Vdd are indicated by 1s. It is assumed that the cell is in a steady state, i.e., that the read/write line is in an inactive state, 0. To better illustrate the operation of this memory cell, transistors in the off state are represented by empty areas.

The initial state represented in FIG. 1B is such that outputs Q and Q* are set to 1 and 0, respectively. Transistors MN1, MP2, MN3, and MN4 are off, and transistors MP1 and MN2 are conductive.

To read the state of this cell, line RW is actuated, which turns on transistors MN3 and MN4 that transmit the state 1 of output Q to line D and the state 0 of output Q* to line D*, respectively.

To change the state of the cell, line RW is actuated; a state 0 is provided to line D and a state 1 is provided to line D*. The 0 present on line D forces output Q to 0. The state 0 of output Q, provided to the gates of transistors MP2 and MN2, turns off transistor MN2 and turns on transistor MP2. Thus, the output Q* is set to 1, which turns off transistor MP1 and turns on transistor MN1 that maintains the state 0 at output Q. A symmetrical effect is obtained with line D* which forces output Q* to 1. The memory cell is then in a new steady state.

Lines D and D* must be controlled, when the state of a cell changes, by a relatively high current since it is desired, for example, to pull the state of output Q down to Vss whereas transistor MP1 pulls this state up to Vdd, and it is also desired to pull the state of the output Q* up to Vdd, whereas transistor MN2 pulls this state down to Vss. For writing in the memory cell, buffers should be provided to impose the states of outputs Q and Q* despite the presence of transistors that tend to impose dissimilar states. A buffer can be disposed between line D and transistor MN3 and a further buffer can be disposed between line D* and transistor MN4.

The cell then occupies a large silicon surface area and consumes a relatively high current at each change of state. This drawback is less impairing if the memory is constituted by a plurality of cells, because only one couple of buffers is provided, associated with lines D and D* on which a plurality of memory cells such as those shown in FIG. 1A are connected in parallel. This drawback is more impairing if the cells are used separately, for example, to fabricate flip-flops or any other circuit using flip-flops (such as registers and counters).

However, as will be seen hereinafter, the cell of FIG. 1A cannot be used without modifications in an environment subjected to bombardments of heavy ions. Hereinafter, a transistor that may cause upset phenomena when its drain region is crossed by a heavy ion is called a <<sensitive transistors>>, and a node connected to the drain of at least one sensitive transistor is called a "sensitive node".

Generally, sensitive transistors are N-channel MOS transistors in an off state having their drain at a voltage close to the high supply voltage Vdd (<<1>>) and P-channel MOS transistors in the off state having their drain at a voltage close to the low supply voltage Vss (<<0>>). When a heavy ion crosses the substrate near the drain region of a sensitive P-channel MOS transistor, a positive parasitic pulse is generated at the drain, i.e., the drain is temporarily pulled up to Vdd. In the instance of a sensitive N-channel MOS transistor, a negative parasitic pulse is generated at its drain, i.e., the drain is temporarily pulled down to Vss.

In the case of FIG. 1B, transistors MN1 and MP2 are sensitive and, depending upon the states of lines D and D*, transistors MN3 and MN4 are also sensitive. As a result, the two nodes Q and Q* are sensitive. During an upset phenomenon on node Q, i.e., if a parasitic pulse is generated on this node, when a heavy ion crosses a sensitive drain region connected to this node, a <<0>> appears on node Q. This passage to <<0>> causes switching of transistors MN2 and MP2, setting to <<1>> of node Q* and node Q remains at <<0>>, i.e., causes the cell changes of state. Similarly, an upset phenomenon on node Q* causes a change in the state of the cell.

In the prior art, it has already been tried to avoid this drawback and to fabricate hardened memory cells insensitive to radiations. A first technological approach aims at fabricating transistors that are inherently insensitive to radiation effects. For this purpose, the transistors are achieved in thin (a few micrometers) silicon layers formed over an insulating substrate. These techniques are usually known as SOS (Silicon On Sapphire) or SOI (Silicon On Insulator). However, such techniques are difficult to implement and are expensive.

A second approach, disclosed in U.S. Pat. No. 5,141,429, consists of using redundant memories and, for example, storing a data in two different memory sub-cells: one fabricated with P-channel MOS transistors, the other with N-channel MOS transistors. This approach causes a significant increase in the required silicon surface area and has the major drawback of having a high stand-by current consumption.

A third approach consists of providing an architecture such that an upset phenomenon on a sensitive node does not cause any change in this cell. In this third approach, it is proposed (refer to IEEE Transactions On Nuclear Science, Volume 35, No. 6, Dec. 1988, pp. 1682–1687, "An SEU Hardened CMOS Data Latch"), to use a memory cell such as that shown in FIG. 1A, surrounded with an array of P-channel MOS transistors whose function is to restore the data modified by an upset phenomenon. This cell occupies a large silicon surface area because some of the transistors that constitute the cell must be large. In addition, such a cell has the drawback, like the cell of FIG. 1A, of having a high switching current and of requiring the provision of buffers.

An object of the present invention is to provide a hardened memory cell having a very low probability of being damaged by bombardments of heavy ions.

Another object of the present invention is to provide such a cell that requires a relatively small silicon surface area.

Another object of the present invention, is to provide a cell having a low switching current.

A further object of the present invention, is to provide a cell that can be included in a conventional SRAM architecture.

To achieve this object, in an embodiment of the present invention, a differential memory cell is provided for storing a differential data present on two data lines when a read/write line is in the active state, a differential data stored in the cell being present on two output nodes. According to the invention, the cell comprises two sets, each including first, second and third transistors successively serially connected between first and second supply voltages, the type of the first transistor being different from that of the second and third transistors. Each output node is the junction between the first and second transistors of a set. The control electrode of one of the second and third transistors of each set is connected to the output node of the other set. The control electrode of the other of the second and third transistors of each set is connected to the control electrode of the first transistor of the same set. A fourth transistor, of the same type as the first transistor, associated with each set, is connected between the first voltage and the control electrode of the first transistor of the set. The control electrode of the fourth transistor is connected to the control electrode of the first transistor of the other set. A fifth transistor, of the same type as the fourth transistor but with a lower conductivity, associated with each set, is connected between the control electrode of the first transistor of the set and the read/write line or the second voltage. The control electrode of the fifth transistor is connected to the output node of the other set.

According to an embodiment of the invention, the cell comprises a sixth transistor associated with each set, connected between a data line and the output node of the set, the control electrode of the sixth transistor being connected to the read/write line.

According to an embodiment of the invention, the fifth transistor is connected between the control electrode of the first transistor of the associated set and the read/write line.

According to an embodiment of the invention, the control electrodes of the first and second transistors of a set are connected together and the control electrode of the third transistor of the set is connected to the output node of the other set.

According to an embodiment of the invention, the fifth transistor is connected between the control electrode of the first transistor of the associated set and the second voltage.

According to an embodiment of the invention, the control electrodes of the first and third transistors of a set are connected together and the control electrode of the second transistor of the set is connected to the output node of the other set.

According to an embodiment of the invention, the cell comprises a sixth transistor associated with each set, connected between a data line and the junction of the second and third transistors of the set, the control electrode of the sixth transistor being connected to the read/write line.

According to an embodiment of the invention, the cell comprises a sixth transistor associated with each set, connected between a data line and the control electrode of the first transistor of the set, the control electrode of the sixth transistor being connected to the read/write line.

According to an embodiment of the invention, the cell comprises a seventh transistor associated with each set, connected as a diode between the second voltage and the third transistor of the set.

Thus, the present invention is within the spirit of the above-mentioned third approach, while having over the previously proposed solutions the advantage of being more insensitive to upset phenomena, of being simpler and of having a lower switching current.

The foregoing and other objects, features, aspects and advantages of the invention will become apparent from the following detailed description of the present invention when taken in conjunction with the accompanying drawings.

FIGS. 1A and 1B, above described, show a structure of a conventional differential SRAM cell;

Figure 1A:
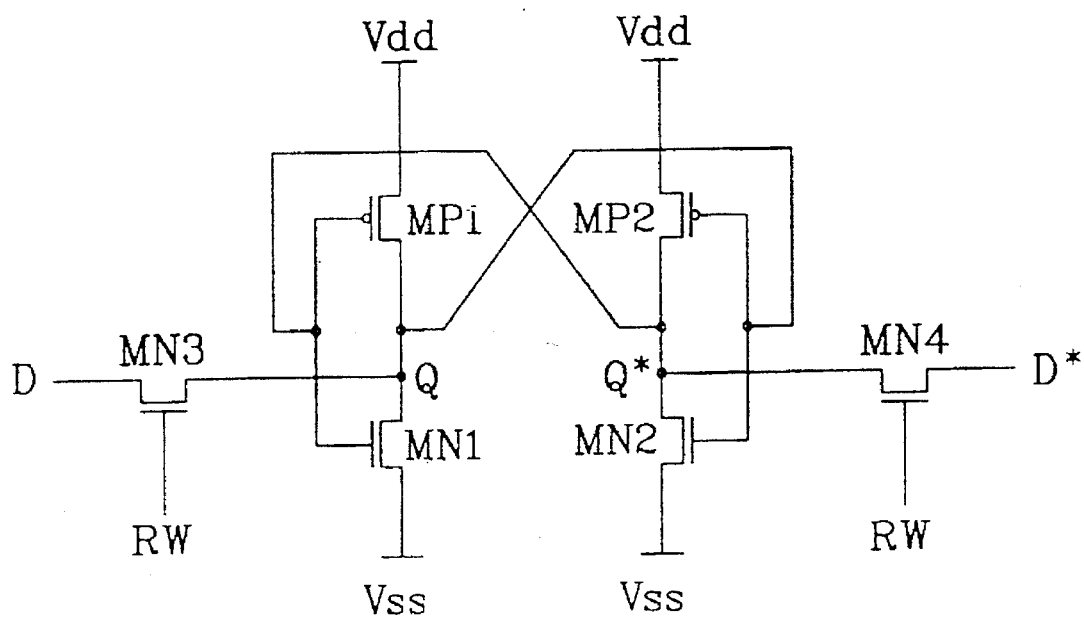
Figure 1B:
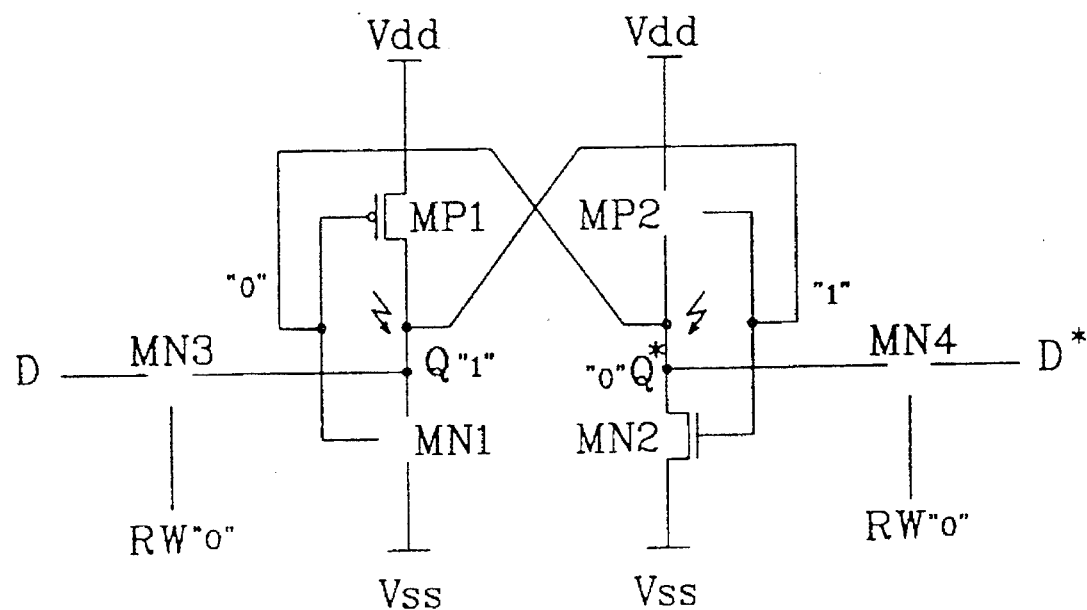
Figure 2A:
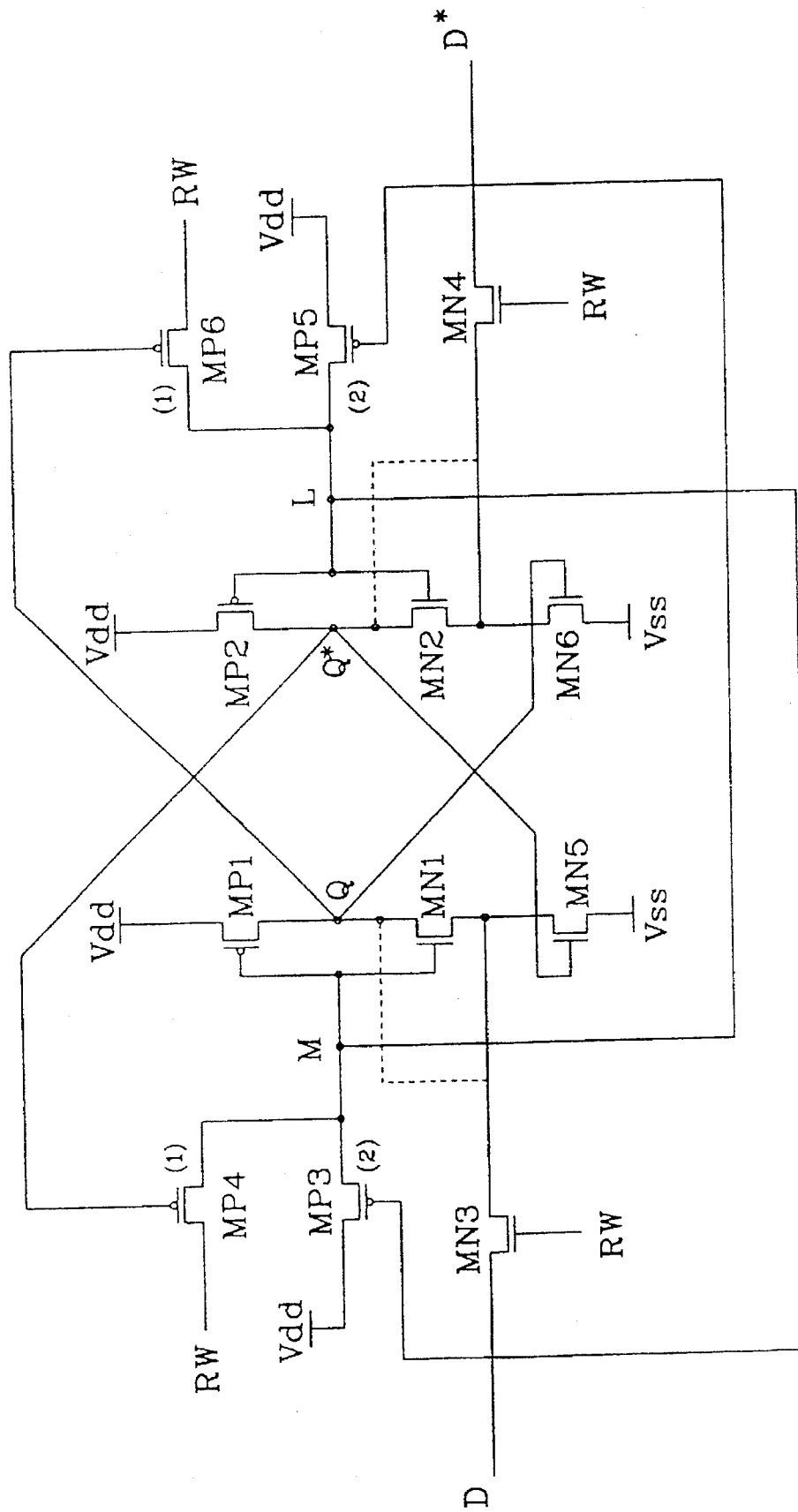
FIGS. 2A–2C represent an embodiment of a hardened differential memory cell according to the present invention in different states.

FIG. 2A represents some elements of FIG. 1A designated with the same references. The sources of transistors MN1 and MN2, instead of being directly connected to the low voltage Vss, as in FIG. 1A, are connected to Vss through N-channel MOS transistors MN5 and MN6, respectively. The gates of transistors MN5 and MN6 are connected to node Q and node Q*, respectively. The gates of transistors MP1 and MN1 are connected to a node M that may be connected to the high voltage Vdd through a P-channel MOS transistor MP3 or to the read/write line RW through a P-channel MOS transistor MP4. It is important, as will be seen hereinafter, that the transconductance of transistor MP3 be higher than the transconductance of transistor MP4. The channel width ratio between transistor MP3 and transistor MP4 is within 1.5 to 3, for example 2. The gates of transistors MP2 and MN2 are connected to a node L that may in turn be connected to the high voltage Vdd or to the line RW through P-channel MOS transistors MP5 and MP6 having the same channel width ratio as transistors MP3 and MP4, respectively. The gates of transistors MP4 and MP6 are connected to node Q and node Q*, respectively. The gates of transistors MP3 and MP5 are connected to node L and to node M, respectively.

Preferably, the read/write transistors MN3 and MN4 are connected between transistors MN1 and MN5, respectively, and between transistors MN2 and MN6. However, the read/write transistors can also be connected, as represented in dotted lines, to nodes Q and Q*, respectively.

Figure 2B:
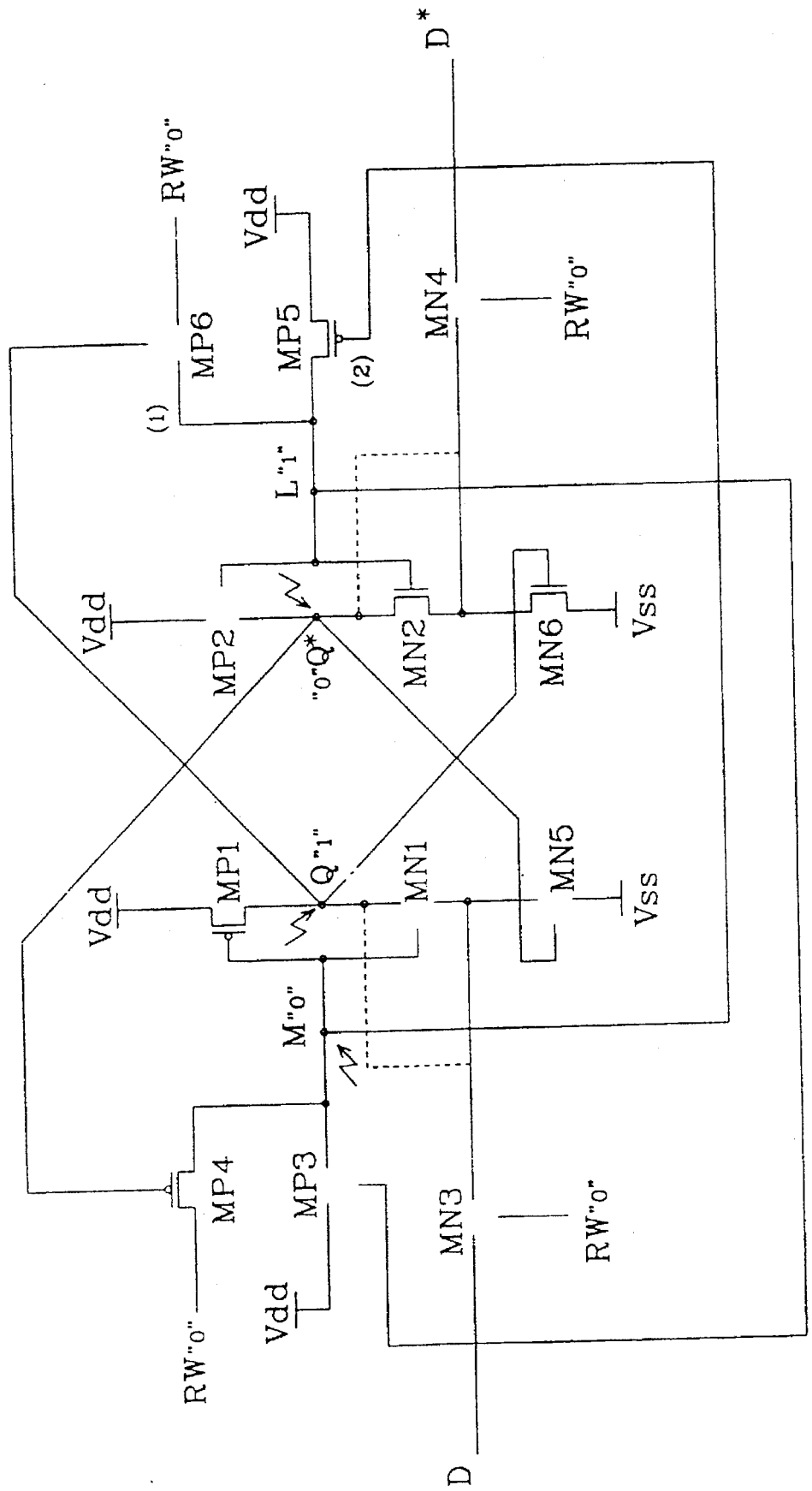

FIG. 2B represents the memory cell of FIG. 2A in an initial state during which nodes Q and Q* are assumed to be set to 1 and 0, respectively. The corresponding states of the other nodes are indicated by 1s and 0s. The state of the read/write line RW is assumed to be inactive, at 0. In this state, transistors MN1, MN2, MN6, MP4 and MP5 are conductive. The other transistors, represented by empty areas, are off.

In its steady state, shown in FIG. 2B, the cell according to the invention does not consume any current.

To modify the state of the cell, the state of node Q must be switched to 0 and the state of node Q* must be switched to 1. For this purpose, line RW is actuated by providing a 0 on line D and the complementary state, 1, on line D*. State 1 of line RW is transferred to node M through transistor MP4. Transistor MP1 is turned off and transistor MN1 becomes conductive. Since transistors MN5 and MP1 are off, node Q is only connected to line D, which imposes its state 0 to node Q by consuming only a drain capacity discharge current. The state 0 of node Q turns off transistor MN6 and turns on transistor MP6. Since line RW is still at 1, the state 1 of node L is not modified by transistor MP6 which is turned on. Since transistors MP2 and MN6 are off, node Q* is only connected to line D*, which imposes its state 1 to node Q* by consuming only a drain capacity charge current. State 1 of node Q* turns on transistor MN5 and turns off transistor MP4. Transistor MN5 maintains the state 0 of node Q. Node M starts to float and maintains, through capacitive effect, the state 1 imposed by line RW.

Figure 2C:
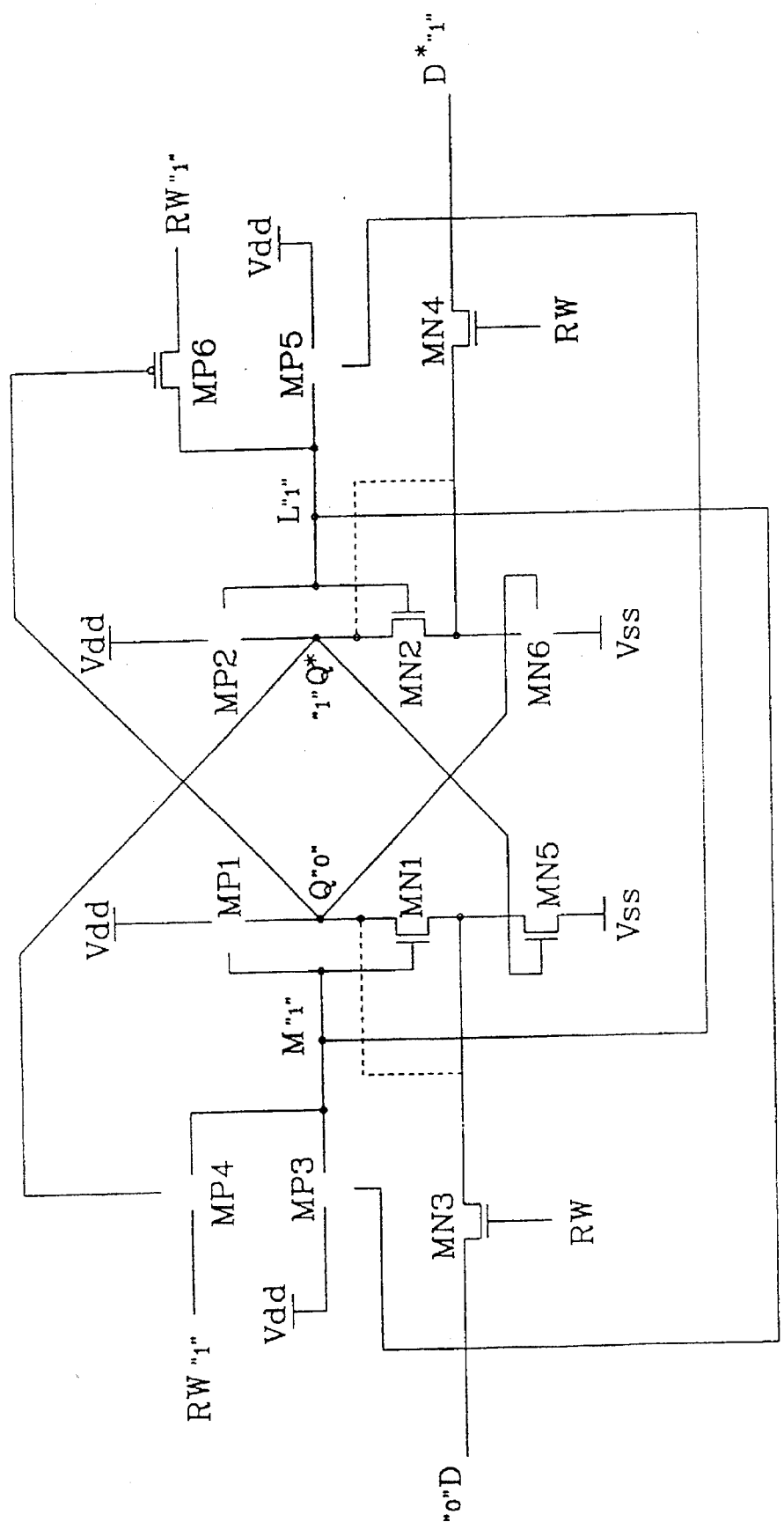

FIG. 2C illustrates an intermediate steady state reached by the cell after the above-described steps and before line RW is reset to its stand-by state 0. Transistors MN1–MN5 and transistor MP6 are conductive whereas the other transistors, represented by empty areas, are off. When line RW returns to 0, node L turns to 0 and transistor MP3 becomes conductive and confirms the state 1 of node M. This state is again a steady state, symmetrical to that of FIG. 2B.

A further modification of the logic state of the cell occurs symmetrically.

If lines D and D* are connected to nodes Q and Q* according to the connection drawn in dotted lines, during a write operation, the cell may consume current on line D during the switching delay of transistor MP1 from its on state to its off state. In contrast, with the connection drawn in solid line, the current consumption is negligible because line D is disconnected from voltage Vdd through either one of transistors MP1 and MN1 which are not simultaneously conductive.

With the connection represented in solid line or the connection represented in dotted lines, a current is consumed on line D* before transistor MN6 is turned off by the passage to 0 of node Q. However, transistor MN6 very rapidly switches, so current is consumed during a very short time, which does not disturb the switching of the cell. With the connection represented in dotted lines, less current is consumed because it flows through two transistors MN2, MN6 that have resistive characteristics.

In both cases, this low switching consumption is a major advantage of the present invention over the prior art cells according to the above-mentioned first and second approaches.

Referring to FIG. 2B, the behavior of the memory cell according to the invention, when parasitics occur, will be considered. In FIG. 2B, zigzag arrows indicate the nodes that are sensitive to upset phenomena in the steady state of the cell. The sensitive nodes are Q, Q* and M. Node Q is rendered sensitive by the drain of transistor MN1, node Q* is rendered sensitive by the drain of transistor MP2, and node M is rendered sensitive by the drain of transistor MP3.

If a parasitic phenomenon occurs on node Q, a <<0>> appears on the gates of transistors MN6 and MP6. Transistor MN6 is turned off and transistor MP6 is turned on. Node Q* starts to float while remaining at its state 0 due to capacitive effect. Transistors MP6 and MP5 are conductive and each transistor tends to impose a different state to node L. As the channel width of transistor MP5 is larger than the channel width of transistor MP6, transistor MP5 continues to impose state 1 (Vdd) to node L. Node Q* still remains floating while maintaining its state 0. Since transistor MP1 remains conductive, node Q is quickly restored to its initial state 1. The size of transistor MP1 is chosen relatively large to restore the initial state of node Q as fast as possible. Similarly, transistor MP2 is selected so as to have the same size.

Further to a parasitic phenomenon on node Q*, this node is turned to 1. Transistor MN5 becomes conductive and transistor MP4 is turned off. Node M starts to float while remaining in its state 0. The fact that transistor MN5 is turned on does not affect the state 1 of node Q because transistor MN1 remains off. Transistors MN2 and MN6 remain conductive and pull node Q* to its initial state 0.

Further to a parasitic phenomenon on node M, this node is turned to 1. Transistor MP1 turns off and transistor MN1 becomes conductive. However, since transistor MN5 is off, node Q starts to float while remaining in its state 1. At the same time, transistor MP5 turns off and causes node L, that remains at its state 1, to float. Thus, a parasitic phenomenon on node M causes nodes Q and L to float without affecting their states and, accordingly, without affecting the states of outputs Q and Q*. Transistor MP4 rapidly pulls node M to its initial state 0.

Further to a parasitic phenomenon simultaneously occurring on nodes Q and Q*, transistor MN5 becomes conductive and transistor MP6 is turned off; however, the states of nodes M and L do not vary, as mentioned above. Node Q* starts to float whereas node Q is rapidly restored to its initial state 1 through transistor MP1. Then, transistor MN6 becomes again conductive and pulls node Q* to its initial state 0.

Parasitic phenomena occurring simultaneously on nodes Q and M or Q* and M may corrupt the state of the cell. However, the probability for two heavy ions to simultaneously bombard two corresponding sensitive drains is very low.

The structure in which the two lines D and D* are connected to nodes Q and Q* (connection represented in dotted lines) is more sensitive to upset phenomena than the second structure (connection represented in solid lines). Considering the steady state of structure shown in FIG. 2B, the drain of transistor MN3 is sensitive and increases the probability for node Q to withstand a parasitic phenomenon with the connection represented in dotted lines.

When the steady state of the memory cell of FIG. 2A is such that nodes Q and Q* are respectively at 0 and 1, the cell behaves symmetrically to a parasitic phenomenon. The role of nodes Q and Q* is inverted, as well as the role of nodes M and L.

Because of the low current consumption on lines D and D* during writing in the memory cell according to the invention, bi-directional buffers associated with lines D and D* need not be provided. This provides a non-negligible reduction in the silicon surface area. A flip-flop fabricated with a cell according to the invention requires a smaller surface area than a flip-flop fabricated with a cell such as the one shown in FIG. 1A, which requires buffers.

Figure 3:
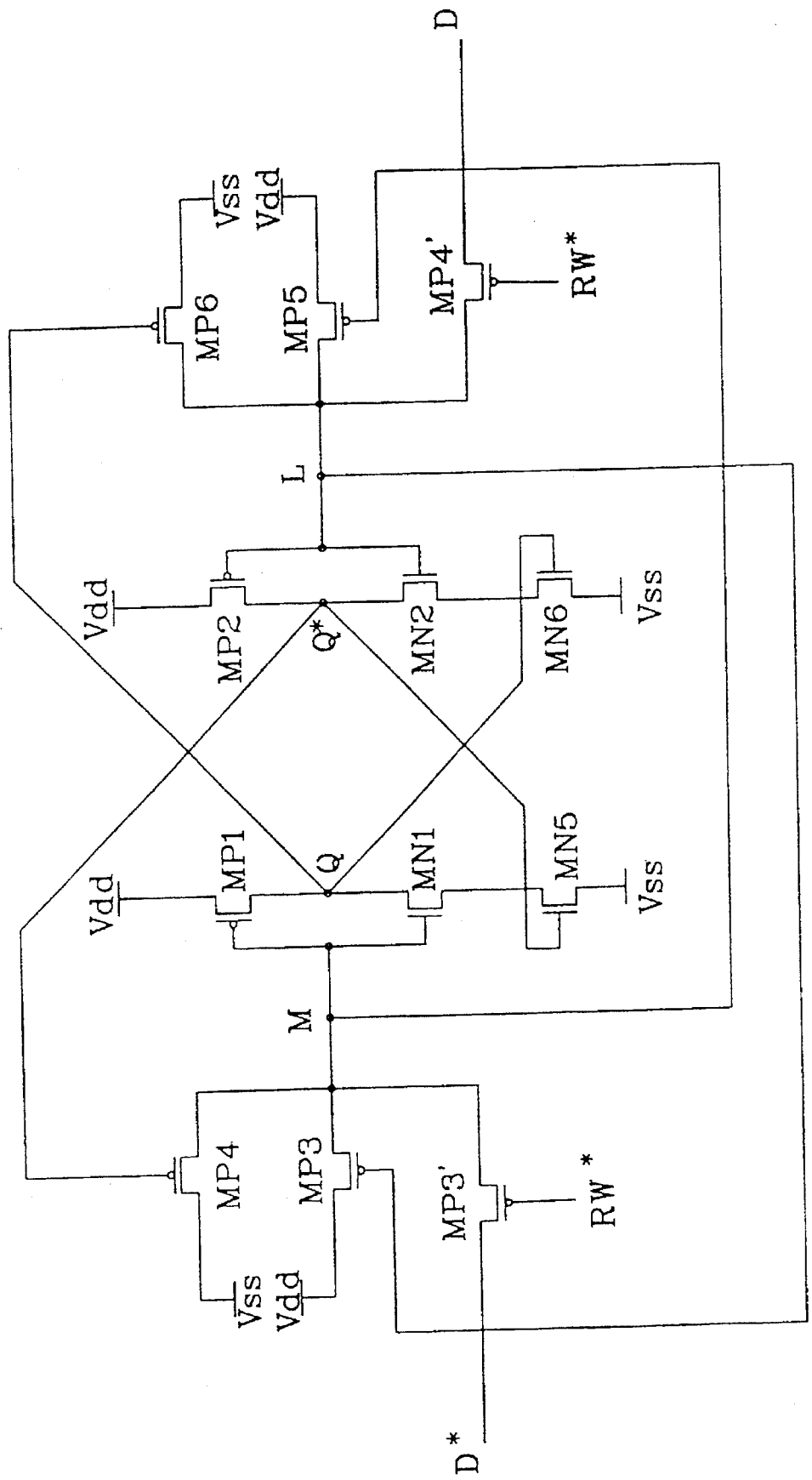
FIG. 3 represents another embodiment of a hardened memory cell according to the invention.

FIG. 3 represents another embodiment of a memory cell according to the invention. This cell differs from the cell of FIG. 2A in that lines D and D* are connected to nodes L and M, respectively, instead of being connected to nodes Q and Q*, and in that transistors MP4 and MP6 are connected to the low supply voltage Vss instead of being connected to the read/write line RW. According to an alternative embodiment of the invention, the read/write transistors MN3 and MN4 of FIG. 2A are replaced with P-channel MOS transistors MP3' and MP4', respectively. The gates of transistors MP3' and MP4' are controlled by a read/write line RW* whose active state is 0 instead of 1. This cell operates like the cell of FIG. 2A and the probability for its being corrupted by a parasitic phenomenon is approximately the same. However, this memory cell consumes more current during write operations.

Figure 4:
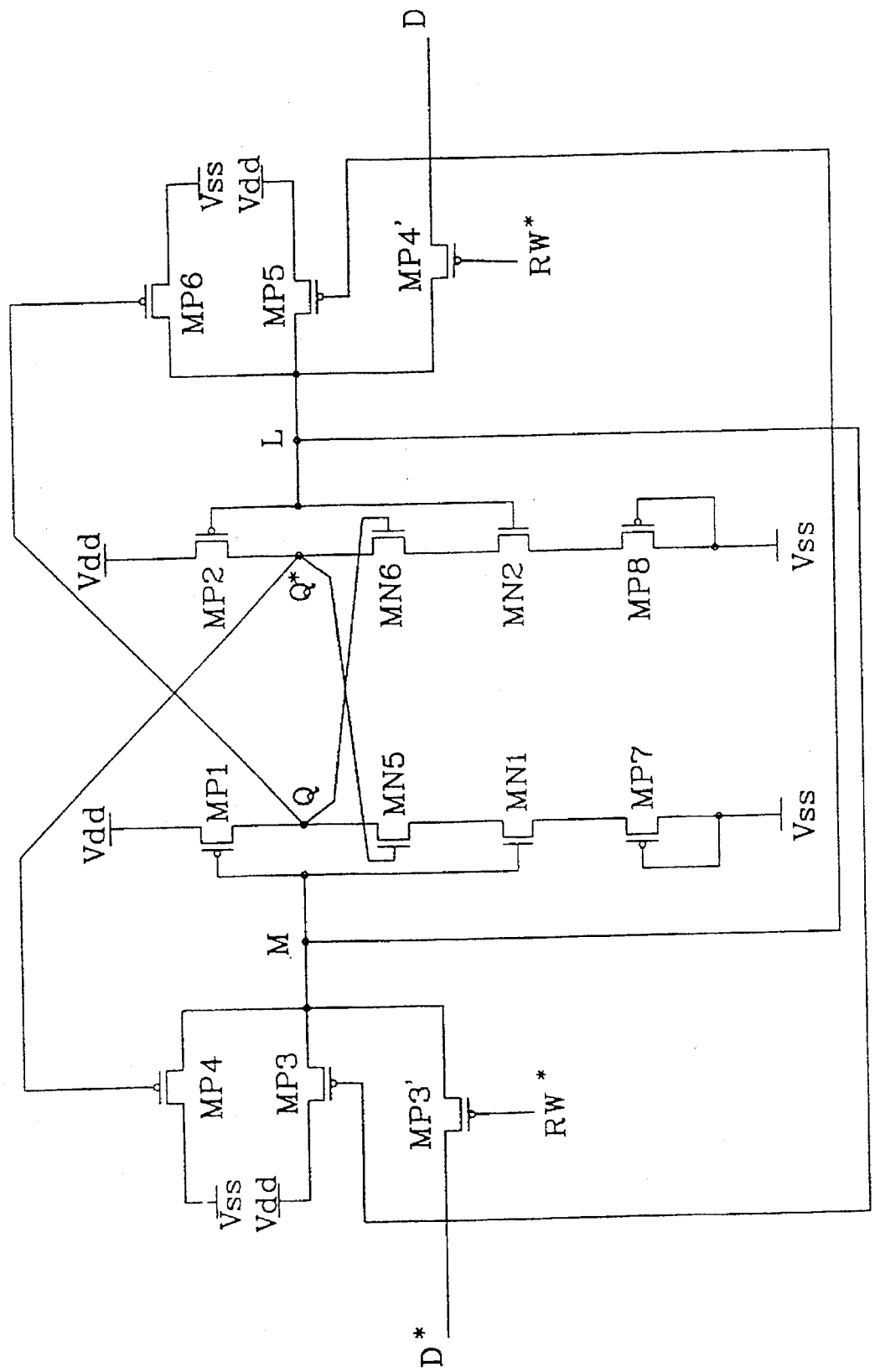
FIG. 4 represents a further embodiment of a hardened memory cell according to the invention.

FIG. 4 represents a further embodiment of the cell according to the present invention. The positions of transistors MN1 and MN5 and the positions of transistors MN2 and MN6 are inverted with respect to the cell of FIG. 3. In addition, P-channel MOS transistors MP7 and MP8, connected as resistors, are connected between the low voltage Vss and transistors MN1 and or MN2, respectively. Transistors MP7 and MP8 disconnect nodes Q and Q* from the low voltage Vss, i.e., transistors MN1 and MN2 are actually turned off when node M is at 0 and node L is at 0, respectively.

This cell operates in the same way as described above and has substantially the same advantages as the cell of FIG. 3.

Those skilled in the art will be able to combine the cells of FIG. 2A, 3 and 4 to form further cells according to the invention.

As is apparent to those skilled in the art, various modifications can be made to the above disclosed preferred embodiments, more particularly for the selection of the polarity and size of the transistors.

We claim:

1. A differential memory cell for storing a differential data present on two data lines when a read/write line is in an active state, a differential data stored in the cell being present on two output nodes, comprising:

two sets, each including first, second and third transistors successively serially connected between first and second supply voltages, the type of the first transistor being different from that of the second and third transistors, and each output node corresponding to the junction between the first and second transistors of a set;

a connection between the control electrode of one of the second and third transistors of each set and the output node of the other set, and a connection between the control electrode of the other of the second and third transistors of each set and the control electrode of the first transistor of the same set;

a fourth transistor, of the same type as the first transistor, associated with each set, connected between the first voltage and the control electrode of the first transistor of the set, the control electrode of said fourth transistor being connected to the control electrode of said first transistor of the other set; and a fifth transistor, of the same type as the fourth transistor but with a lower conductivity, associated with each set, connected between the control electrode of the first transistor of the set and the read/write line or the second voltage, the control electrode of said fifth transistor being connected to the output node of the other set.

2. The differential memory cell of claim 1, comprising a sixth transistor associated with each set, connected between a data line and the output mode of the set, the control electrode of the sixth transistor being connected to the read/write line.

3. The differential memory cell of claim 1, wherein the fifth transistor is connected between the control electrode of the first transistor of the associated set and the read/write line.

4. The differential memory cell of claim 1, wherein the control electrodes of the first and second transistors of a set are connected together and wherein the control electrode of the third transistor of the set is connected to the output node of the other set.

5. The differential memory cell of claim 1, wherein the fifth transistor is connected between the control electrode of the first transistor of the associated set and the second voltage.

6. The differential memory cell of claim 1, wherein the control electrodes of the first and third transistors of a set are connected together and wherein the control electrode of the second transistor of the set is connected to the output node of the other set.

7. The differential memory cell of claim 1, comprising a sixth transistor associated with each set, connected between a data line and the junction of the second and third transistors of the set, the control electrode of the sixth transistor being connected to the read/write line.

8. The differential memory cell of claim 1, comprising a sixth transistor associated with each set, connected between a data line and the control electrode of the first transistor of the set, the control electrode of the sixth transistor being connected to the read/write line.

9. The differential memory cell of claim 1, comprising a seventh transistor associated with each set, connected as a diode between second voltage and the third transistor of the set.

* * * * *